United States Patent
Tong et al.

(10) Patent No.: US 8,613,863 B2
(45) Date of Patent: Dec. 24, 2013

(54) METHODS FOR SELECTIVE ETCHING OF A MULTI-LAYER SUBSTRATE

(75) Inventors: Jinhong Tong, Santa Clara, CA (US); Frederick Fulgenico, San Jose, CA (US); ShouQian Shao, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 155 days.

(21) Appl. No.: 13/305,949

(22) Filed: Nov. 29, 2011

(65) Prior Publication Data

US 2013/0137275 A1    May 30, 2013

(51) Int. Cl.
- B44C 1/22 (2006.01)
- C03C 15/00 (2006.01)
- C03C 25/68 (2006.01)
- C23F 1/00 (2006.01)
- C23F 3/00 (2006.01)

(52) U.S. Cl.
USPC ................ 216/57; 216/95; 216/100; 216/104

(58) Field of Classification Search
USPC .......................................................... 216/57
See application file for complete search history.

(56) References Cited

U.S. PATENT DOCUMENTS

| | | | |
|---|---|---|---|
| 5,227,013 A | 7/1993 | Kumar | |
| 5,314,578 A | 5/1994 | Cathey | |
| 6,692,976 B1 * | 2/2004 | Mirkarimi et al. | 438/3 |
| 7,410,748 B2 | 8/2008 | Keller | |
| 7,476,951 B2 | 1/2009 | Campbell et al. | |
| 8,039,383 B2 | 10/2011 | Lazovsky | |
| 2001/0016380 A1 * | 8/2001 | Watanabe et al. | 438/237 |
| 2007/0195123 A1 * | 8/2007 | Deguchi et al. | 347/44 |
| 2008/0200003 A1 | 8/2008 | Hong | |
| 2012/0267598 A1 * | 10/2012 | Sakotsubo et al. | 257/4 |

OTHER PUBLICATIONS

Gouil, A., et al.; PolySiTiNFfo[sub 2] Gate Stack Etching in HighDensity Plasmas; Jan. 1, 2007; Z—Book—Author; Journal of Vacuum Science and Technology B Microelectronics and Nanometer Structures vol. 25 No. 3. 2007 pp. 767778.

\* cited by examiner

*Primary Examiner* — Binh X Tran
*Assistant Examiner* — Thomas Pham

(57) ABSTRACT

A method is disclosed for the selective etching of a multi-layer metal oxide stack comprising a platinum or tungsten layer on a TiN layer on an $HfO_2$ or $ZrO_2$ layer on a silicon substrate. In some embodiments, the method comprises a physical sputter process to selectively etch the platinum layer, followed by a first wet etch using a mixture of $NH_4OH$ and $H_2O_2$ to selectively etch the TiN layer, and a second wet etch using a dilute mixture of HF and HCl to selectively etch the $HfO_2$ or $ZrO_2$ layer.

7 Claims, 11 Drawing Sheets

---

Forming a metal oxide stack comprising a capping platinum layer on an electrode TiN layer on a metal oxide $HfO_2$ or $ZrO_2$ layer on a silicon substrate
900

↓

Performing an argon sputtering process to selectively etch the capping layer of platinum
910

↓

Performing a wet etch using a mixture of $NH_4OH$ and $H_2O_2$ to selectively etch the top electrode layer of TiN
920

↓

Performing a wet etch using a dilute mixture of HF and HCl to selectively etch the metal oxide layer of $HfO_2$ or $ZrO_2$
930

METHODS FOR SELECTIVE ETCHING OF A MULTI-LAYER SUBSTRATE

FIELD OF THE INVENTION

The present invention relates generally to a process for etching a multi-layer substrate, and more particularly to a selective etching process for metal oxide stacks.

BACKGROUND OF THE INVENTION

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Current ReRAM structures use multi-layer thin film stacks of insulator materials, such as metal oxides (e.g., hafnium oxide or zirconium oxide) between metal electrodes to form a device that can be switched between two different stable resistance states by the application of appropriate voltages. A capping layer can be provided on the top electrode to improve the thin film stack fabrication or the ReRAM operation. For example, a capping layer can protect the electrode from being oxidized or from being etched during a plasma stripping or a plasma etch process. In some cases, the capping layer might increase the conductivity for interconnect lines connecting adjacent ReRAM devices. The capping layer can also served as a gettering agent during device fabrication or operation. For example, a titanium capping layer can attract oxygen from the metal oxide layer, helping oxygen vacancies for form more easily, thus reducing the setting voltage.

The manufacture of multi-layer ReRAM structures, and similar semiconductor devices typically involves patterning of the multiple layers by etching using liquid or wet etching solutions. For example, one well known etching solution is hydrofluoric acid, which can etch the silicon oxide isotropically, i.e., same etch rate in both lateral and perpendicular directions. This can result in etched features that have smaller line widths than those of the patterning images.

Patterning using etching can also use dry etching techniques, which are conducted in a gas phase using physical sputtering by target bombardment with energetic particles such as argon, or using plasma etching by reactive ions of halogens or halogen-containing compounds. The dry etching technology employs exited ions, typically generated by an RF plasma, for etching the layer materials. In the dry etch process, etching is typically anisotropic, resulting in etched features that have line widths substantially matching those of the patterning images. Generally, the term "plasma etching" describes reactive ion etching, where ions of reactive elements (such as halogen elements of fluorine, chlorine, etc.) are excited by a plasma, and then allowed to react with the layer materials to form volatile species. The terms "physical sputtering" and "physical sputter etch" are used interchangeably in the present description, and describe bombardment of the substrate with energetic particles which can be generated by a plasma or an ion source. The sputtering process is driven by momentum exchange between the energetic particles and the layer materials, and therefore the particle in a physical sputtering process is typically an inert element, such as argon or xenon.

An important aspect in forming a multi-layer semiconductor device is the control of the patterning process with respect to the different layers in the metal oxide stack. The poor selectivity can cause under or over etch issues and cross-contamination/residues remaining after the etch process.

Therefore, a need exists for a process for high selective etching of multi-layer substrates.

SUMMARY OF THE DISCLOSURE

In some embodiments, the present invention discloses a selective etch method for patterning a multilayer ReRAM stack. The method comprises providing a multi-layer substrate, typically a semiconductor device, having a plurality of layers, include a capping layer of platinum or tungsten formed on a top electrode layer of TiN or TaN formed on a metal oxide layer of $HfO_2$ or $ZrO_2$ formed on a silicon substrate.

In some embodiments, the present invention discloses a combination of selective wet and dry etching processes to pattern the metal oxide stack. The processes comprise a physical sputtering to etch a capping layer of platinum or tungsten, which can be highly selective against a patterned photoresist layer and the top electrode materials of titanium or tantalum nitride. The top electrode of TiN layer then can be selectively wet etched using Standard Clean 1 (SC-1, comprising a mixture of $NH_4OH$ and $H_2O_2$), stopping on the metal oxide layer of $HfO_2$ or $ZrO_2$. A wet etch solution comprising dilute HF and HCl can be effective in etching the metal oxide layer of $HfO_2$ or $ZrO_2$ with minimum damage to the isolation layer of $SiO_2$ and stopping on the polysilicon substrate.

In some embodiments, the present invention discloses a combination of selective dry etching processes to pattern the metal oxide stack. The processes comprise a physical sputtering to etch a capping layer of platinum or tungsten, which can be highly selective against a patterned photoresist layer and the top electrode materials of titanium or tantalum nitride. The top TiN electrode and the metal oxide of $HfO_2$ or $ZrO_2$ then can be selectively plasma etched using $CHF_3$ and oxygen chemistries, stopping on the polysilicon substrate and on the silicon oxide isolation layer.

In some embodiments, the present invention discloses a combination of selective wet etching processes to pattern the metal oxide stack. The processes comprise a Standard Clean 1 (SC-1, comprising a mixture of $NH_4OH$ and $H_2O_2$) to selectively etch a cap layer of tungsten, together with a top electrode layer of titanium nitride or tantalum nitride, stopping on the metal oxide layer of $HfO_2$ or $ZrO_2$. A wet etch solution comprising dilute HF and HCl can be effective in etching the metal oxide layer of $HfO_2$ or $ZrO_2$ with high selectivity to isolation layer of $SiO_2$ and stopping on the polysilicon substrate with minimum damage.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION OF THE PREFERRED EMBODIMENTS

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, the present invention discloses a selective etch method for patterning a multilayer ReRAM stack. High selectivity for different layers of the multilayer ReRAM stack can avoid undercut or overcut, improving yield and reliability of the ReRAM devices. In addition, high selectivity etching can offer complete removal of the etched materials, avoiding cross contamination or remaining residues.

In some embodiments, the present invention discloses resistive-switching memory elements using resistive-switching metal oxide layers. For example, a metal-insulator-metal (MIM) memory element can be formed from two electrodes and one or more layers of one or more metal oxides disposed therebetween. Embodiments described herein provide methods for forming improved memory devices, such as a ReRAM cells, and also provide optimized patterning processes for forming metal oxide film stacks.

In some embodiments, the present invention discloses an improved metal oxide layer suitable for use in a memory device based upon controlled change of resistance, and a method for making such a layer. More specifically, highly selective etching processes may be used to pattern the metal oxide multilayer stack in a predictable, controlled manner, which can lead to greater yield and more predictable operation. In general, the selective etch method comprises selective wet etches, selective plasma etches (e.g., reactive ion etching with halogen species), selective physical sputtering (e.g., bombardment of the target by energetic argon ions), or a combination of selective wet etches, plasma etches, and physical sputtering, which can control the patterning of the metal oxide multilayer stack for improved device structures and performance. The present selective etch processes are tailored to meet the specific metal oxide multilayer stacks, providing optimum fabrication processes for ReRAM devices.

Figure 1:
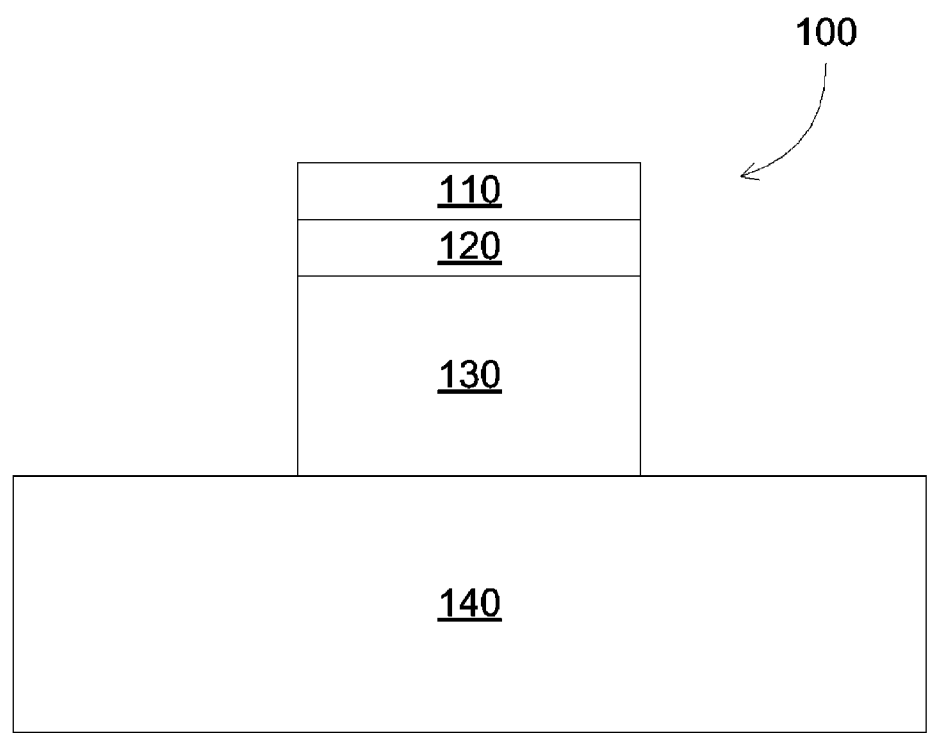
FIG. 1 illustrates an exemplary multilayer metal oxide stack according to some embodiments of the present invention.

FIG. 1 illustrates an exemplary multilayer metal oxide stack according to some embodiments of the present invention. The multilayer metal oxide stack 100 comprises a capping layer 110 of platinum or tungsten formed on a top electrode layer 120 of TiN or TaN formed on a metal oxide layer 130 of $HfO_2$ or $ZrO_2$ formed on a silicon substrate 140. The illustrated metal oxide stack is merely illustrative, and one skilled in the art will appreciate that additional layers or different layers may be used without deviating from the basic scope of the invention described herein. For example, the silicon substrate 140 can comprise one or more polysilicon layers disposed on a support substrate.

Figure 2:
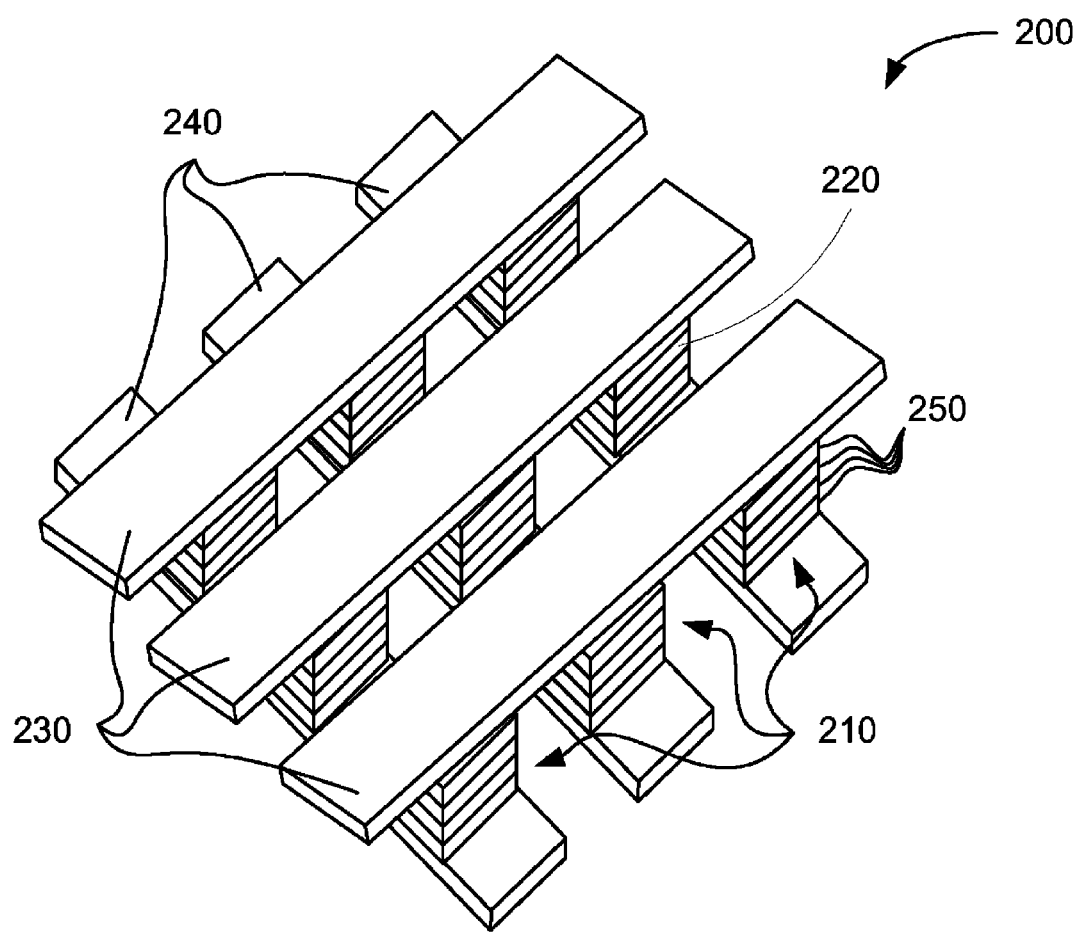
FIG. 2 illustrates an exemplary memory array according to some embodiments of the present invention.

FIG. 2 illustrates an exemplary memory array according to some embodiments of the present invention. A memory array 200 comprises a plurality of nonvolatile resistive switching memory devices 210 (hereafter switching memory device 210), which each generally include at least one resistive switching memory element 220. Memory array 200 may be part of a larger memory device or other integrated circuit structure, such as a system on a chip type device. Read and write circuitry is connected to switching memory devices 210 using word-lines and orthogonal bit-lines, which are referred to herein generally as electrodes 230 and 240, and are used to read from or write data into the memory element 220. Electrodes 230 and 240 generally include one or more conductive layers that each has a desired function in the array of switching memory devices 210. In some configurations, the electrodes 230 and 240 each comprise two or more conductive layers in which a first conductive layer is used to interconnect the multiple switching memory devices 210 and a second conductive layer is disposed in each switching memory device 210 to provide a desirable electrical interface (e.g., desirable work function) to the adjacent components in the switching memory device 210. Individual switching memory devices 210 or groups of switching memory devices 210 can be accessed using appropriate sets of word-lines and bit-lines, or electrodes 230 and 240. The memory elements 220 in the switching memory devices 210 may be formed from one or more layers 250 of materials, as schematically indicated. In addition, memory arrays such as memory array 200 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

Figure 3:
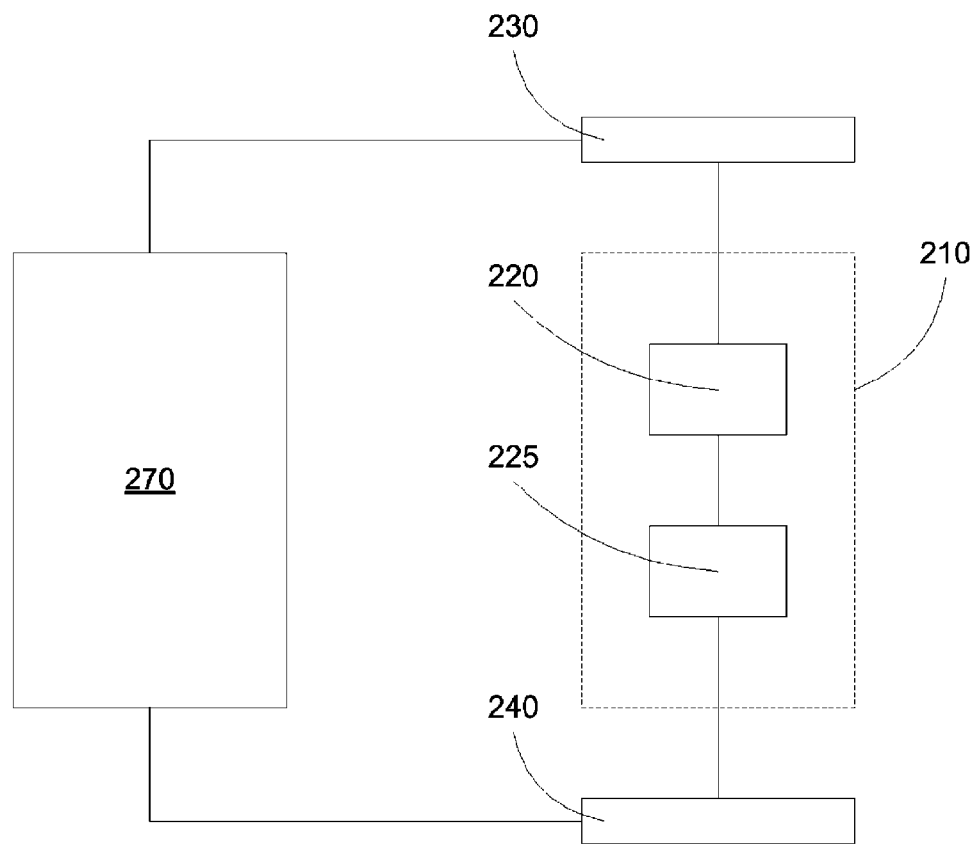
FIG. 3 illustrates an exemplary memory device according to some embodiments of the present invention.

FIG. 3 illustrates an exemplary memory device according to some embodiments of the present invention. A switching memory device 210 is shown that contains a memory element 220 and an optional current steering device 225, which are both disposed between the electrodes 230 and 240. In one configuration, the current steering device 225 is an intervening electrical component, such as a p-n junction diode, p-i-n diode, transistor, or other similar device that is disposed between electrode 230 and memory element 220, or between the electrode 240 and memory element 220. In some embodiments, the current steering device 225 may include two or more layers of semiconductor material, such as two or more doped silicon layers, that are configured to allow or inhibit the current flow in different directions through the memory element 220 when that memory element is not selected to read.

In some embodiments, the current steering device 225 is a diode type current steering device that preferentially allows current to flow through the memory device 210 in a forward direction. However, a reduced current can also flow in the opposing direction through the device by the application of a reverse bias to the electrodes 230 and 240.

Figure 4:
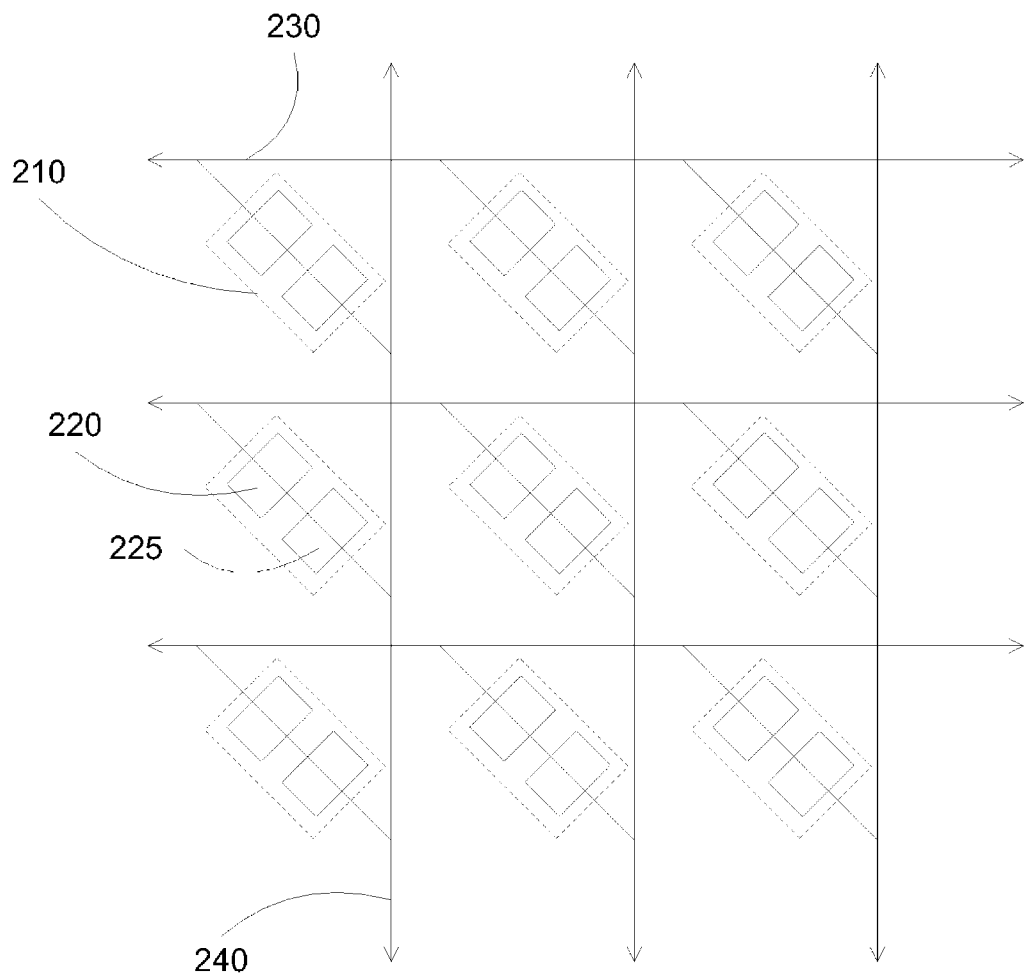
FIG. 4 illustrates an exemplary integrated memory circuit according to some embodiments of the present invention.

FIG. 4 illustrates an exemplary integrated memory circuit according to some embodiments of the present invention. An array of switching memory devices 210 is shown that are connected together to form part of a high-capacity nonvolatile memory integrated circuit. Each of the individual switching memory devices 210 can be accessed using appropriate sets of discrete word-lines and bit-lines, which, as noted above, may comprise at least a portion of the electrodes 230 and 240.

Each of the switching memory devices 210 contains a memory element 220 and current steering device 225 (e.g., a diode type) that are connected to at least one of the electrodes 230 and at least one of the electrodes 240. The electrodes 230 and/or 240 are generally biased by circuitry that is connected at the periphery of the memory chip on which the array of memory devices 210 is formed.

During operation, such as a read operation, the state of a memory element 220 in the switching memory device 210 can be sensed by applying a sensing voltage (e.g., a "read" voltage $V_{READ}$), such as applying about +0.5 volts (V), to an appropriate set of electrodes 230 and 240. Depending on its history, a memory element that is addressed in this way may be in either a high resistance state (HRS) or a low resistance state (LRS). The resistance of the memory element 220 therefore determines what digital data is being stored by the memory element 220. If the memory element 220 is in the high resistance state, for example, the memory element may be said to contain a logic "one" (i.e., a "1" bit). If, on the other hand, the memory element is in the low resistance state, the memory element may be said to contain a logic "zero" (i.e., a "0" bit). During a write operation, the state of a memory element can be changed by application of suitable write signals to an appropriate set of electrodes 230 and 240.

In some embodiments, the memory element 220 uses bipolar switching where opposite polarity set and reset voltages are used to alter the resistance of the memory element between high and low resistance states. In one example, initially, memory element 220 may be in a high resistance state (e.g., storing a logic "zero"). The high resistance state of memory element 220 can be sensed by read and write circuitry 270 (FIG. 3) using electrodes 230 and 240. For example, read and write circuitry may apply a read voltage $V_{READ}$ to memory element 220, and can sense the resulting "off" current ($I_{OFF}$) that flows through memory element 220. When it is desired to store a logic "one" in memory element 220, memory element 220 can be placed into its low-resistance state. This may be accomplished by using read and write circuitry 270 to apply a set voltage $V_{SET}$ (e.g., about −2 V to about −4 V) across electrodes 230 and 240. In one configuration, applying a negative $V_{SET}$ voltage to memory element 220 causes memory element 220 to switch to its low resistance state. It is believed that the change in the resistive state of memory element 220 may be due to the redistribution or filling of traps or defects, in the resistive switching layer, or variable resistance metal oxide layer, when the device is reverse biased. The defects or traps, which are commonly formed during the deposition or initial burn-in or forming of the variable resistance metal oxide layer, are often created by a non-stoichiometric material composition found in the formed variable resistance metal oxide layer. $V_{SET}$ and $V_{RESET}$ are generally referred to as "switching voltages" herein.

The low resistance state of the memory element 220 can be sensed using the read and write circuitry 270. When a read voltage $V_{READ}$ is applied to resistive switching memory element 220, the read and write circuitry 470 will sense the relatively high "on" current value ($I_{ON}$), indicating that memory element is in its low resistance state. When it is desired to store a logic "zero" in memory element, the memory element can once again be placed in its high resistance state by applying a positive reset voltage $V_{RESET}$ (e.g., about +2 V to about +5 V) to memory element. When read and write circuitry applies $V_{RESET}$ to memory element, memory element enters its high resistance state. When the reset voltage $V_{RESET}$ is removed from memory element 220, memory element will once again be characterized by high resistance when the read voltage $V_{READ}$ is applied. Voltage pulses can be used in the programming of the memory element. For example, a 1 microseconds (ms) to 1 nanoseconds (ns) square or trapezoidal shaped pulse can be used to switch the memory element. In some embodiments, it may be desirable to adjust the length of the pulse depending on the amount of time needed to switch the memory element. In one example, the "set" and "reset" pulses are each about 10 ns in length. While the discussion of the memory element herein primarily provides bipolar switching examples, some embodiments of the memory element may use unipolar switching, where the set and reset voltages have the same polarity, without deviating from the scope of the invention described herein.

To provide a measurable difference between the logic "zero" and logic "one" states it is common to form the variable resistance layer and other memory element components so that the difference between the $I_{ON}$ and $I_{OFF}$ currents have a difference of at least one order of magnitude (e.g., current ratio $I_{ON}/I_{OFF} \geq 10$). In other words, the ratio of the electrical resistances of the variable resistance layer is decreased by at least 10 times when switching between the high and the low resistance states.

In an effort to prepare the memory element for use, it is common to apply a forming voltage ($V_{FORM}$) at least once across the electrodes 230, 240 to "burn-in" the device. It is believed that the application of a forming voltage, which is typically significantly greater than the $V_{RESET}$ and $V_{SET}$ voltages, causes the defects that are formed within the variable resistance layer during the device fabrication process to move, align and/or collect within various regions of the formed layer, causing the variable resistance layer to consistently and reliably switch between the "on" and "off" resistive states throughout the memory element's life. In some embodiments, the forming voltage is between about 1 and about 5 times greater than the $V_{RESET}$ or $V_{SET}$ voltage. In some embodiments, the forming voltage is between about 1.4 and about 2.5 times greater than the $V_{RESET}$ or $V_{SET}$ voltage. In some embodiments, the forming voltage is between about 2 and about 7 volts. However, it is noted that in some cases it is desirable to form the memory element so that the application of a forming voltage is not required at all to assure that the device will perform as desired throughout its life.

Figure 5:
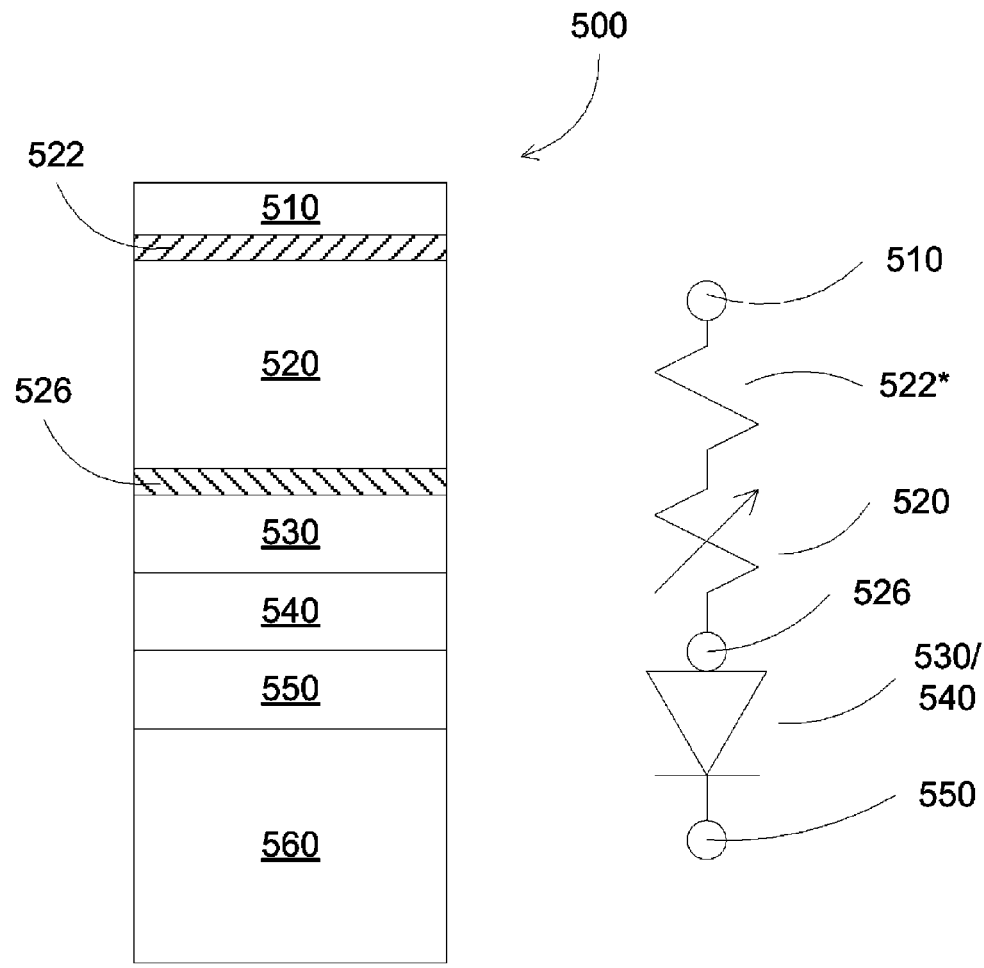
FIG. 5 illustrates an exemplary memory device according to some embodiments of the present invention.

FIG. 5 illustrates an exemplary memory device according to some embodiments of the present invention. A memory device 500 comprising a memory element and a current steering device such as a diode 530/540 is formed on substrate 560. The current steering device can comprise a p-n junction, for example, with a p-doped polysilicon layer 530 disposed on an n-doped polysilicon layer 540. Optional electrode 550 can be used for contact.

The memory element generally contains a top electrode 510 and metal oxide layer 520 acting as a variable resistance layer. In some embodiments, interface layers for the metal oxide layer 520 can be included, for example, to improve contact resistance or device performance. For example, the memory element can comprise interface layer 526 interfacing the metal oxide layer 520 and the polysilicon 530 and/or interface layer 522 interfacing the metal oxide layer 520 and the electrode 510.

The metal oxide variable resistance layer 520 can be a dielectric material, such as a metal oxide material or other similar material that can be switched between at least two or more stable resistive states. In some embodiments, the variable resistance layer 520 is a high bandgap material (e.g., bandgap >4 electron volts (eVs)), such as hafnium oxide ($Hf_xO_y$), or zirconium oxide ($Zr_xO_y$). It has been found that using high band gap variable resistance layer materials will improve data retention in the memory element, and reduce the leakage current in the formed memory element device, since the amount of trapped charge in the variable resistance layer material with a high band gap will be less than the amount of trapped charge in the variable resistance layer material with a lower band gap material, and the high band gap materials create a large barrier height that the carriers have to cross during the read, set and reset operations. The variable resistance layer 520 may comprise a metal oxide (e.g., $HfO_2$) layer formed to a thickness of between about 10 and about 100 angstroms (Å).

Electrode materials 510 or 550 may include silicon, doped silicon (e.g. n-type or p-type polysilicon), titanium nitride (TiN), or tantalum nitride (TaN). The electrodes are formed from conductive materials that have a desirable work function. In other embodiments, the electrodes can be multi-layer electrodes that can include one or more different materials. The multi-layer electrodes can be used to improve adhesion properties and performance of memory elements in some configurations and embodiments. The insulator or semiconductor device layer of the MIM stack can also be constructed using multiple layers of oxides. The combination of oxides can be used to impart desired characteristics to memory cells. Other layers may also be used, such as for example, a defect access layer, or another electrical device such as an embedded transistor or diode (referred to below as a "current steering element"). Current steering elements may include, for example, diodes, p-i-n diodes, silicon diodes, silicon p-i-n diodes, transistors, etc. Current steering elements may be connected in series in any suitable location within or adjacent to the memory cell, including in between one of the electrodes and the remainder of a cell or oxide stack, referenced above. Current steering elements may be used to enhance operation or control of memory cells (or other semiconductor structures), depending on the application.

Figure 6A:
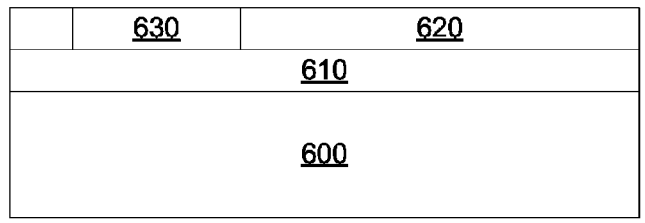
FIGS. 6A-6E illustrate an exemplary method for forming a memory device according to some embodiments of the present invention.

FIGS. 6A-6E illustrate an exemplary method for forming a memory device according to some embodiments of the present invention. In FIG. 6A, a substrate 600 is provided. The substrate 600 can be a semiconductor substrate having active devices fabricated thereon (not shown). A conductive layer 610 is formed on the substrate 600. The conductive layer 610 can be patterned to form an electrode layer, for example, word line electrode 230 shown in FIG. 2. Conductive layer 630 is patterned on the conductive layer 610, with insulating layer 620 acting as an isolation layer. In some embodiments, the conductive layer 630 comprises multiple layers, such as a contact layer (such as contact layer 550 shown in FIG. 5) for contacting the electrode layer 610 and multiple doped silicon layers (such as a p-doped polysilicon layer 530 disposed on an n-doped polysilicon layer 540 shown in FIG. 5) formed on the contact layer acting as a current steering device. In some embodiments, the conductive layer 630 comprises a polysilicon surface, such as the surface of the p-doped polysilicon layer 530.

Figure 6B:
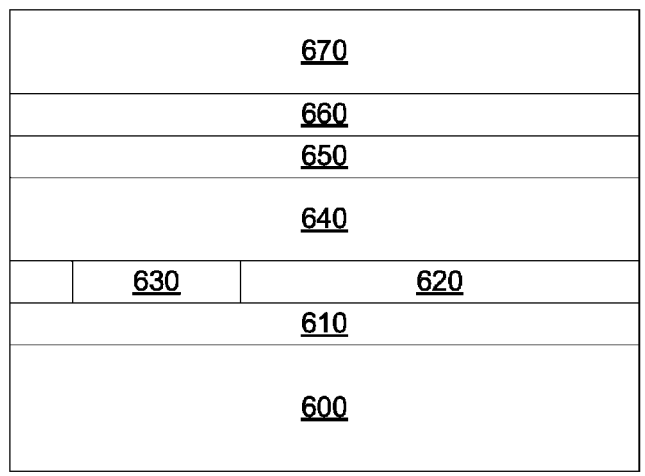

In FIG. 6B, a metal oxide stack is formed on the substrate. The metal oxide stack comprises a capping layer 660, such as a platinum or a tungsten layer, formed on a top electrode layer 650, such as a TiN or TaN layer, formed on a metal oxide layer 640, such as a hafnium oxide or zirconium oxide layer. The layers can be formed on the whole substrate. The capping layer 660 can be used to protect the electrode layer 650.

After forming the metal oxide stack, a patterning process, such as a photolithography process, is performed to form the memory element. A standard photolithography process comprises forming a photoresist layer 670 on the top layer 660.

Figure 6C:
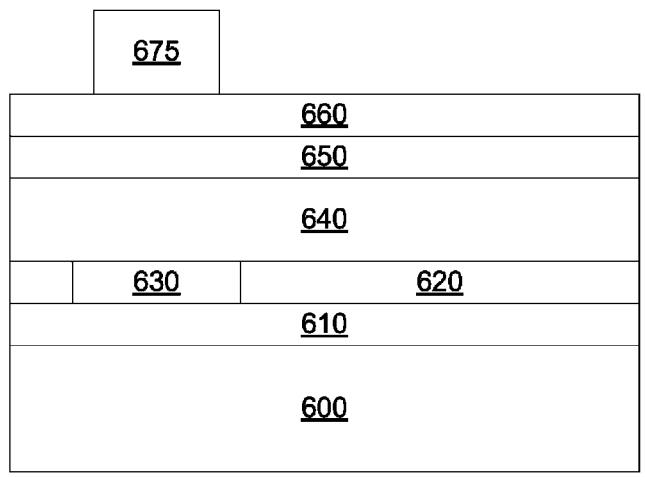

In FIG. 6C, the photoresist layer 670 is patterned to form photoresist pattern 675 on the metal oxide stack. The photoresist pattern 675 can served as a mask to etch the metal oxide stack.

Figure 6D:
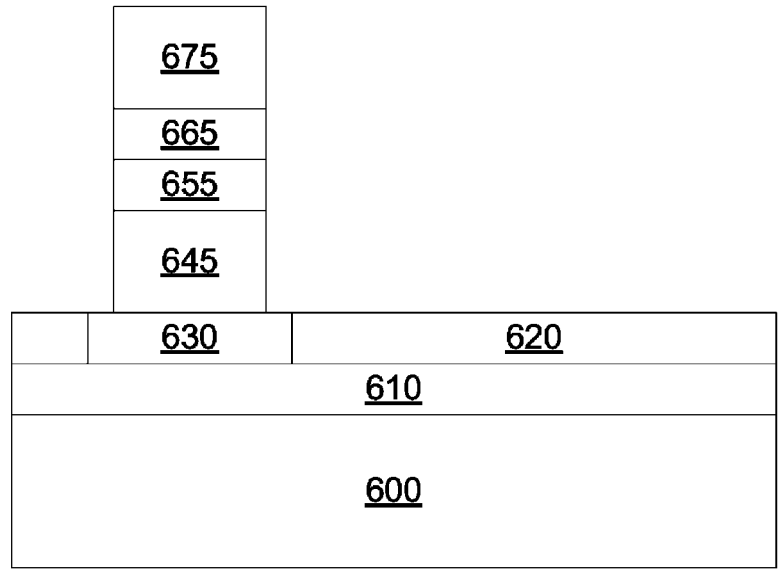
Figure 6E:
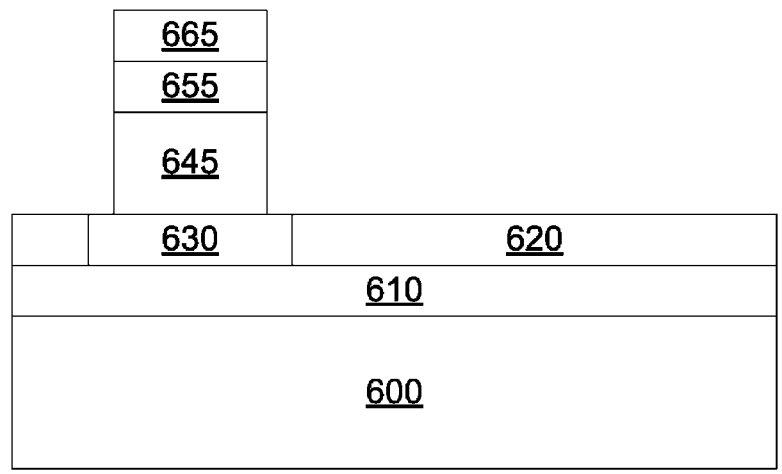

In FIG. 6D, the multi-layers of capping layer 660, top electrode layer 650, and metal oxide layer 640 are patterned to form a metal oxide stack, comprising the capping 665, the electrode 655 and the metal oxide 645. In FIG. 6E, the photoresist mask 675 is removed, and the substrate can be subjected to further processing to complete the memory array.

In some embodiments, the present invention discloses optimized selective etching processes to pattern the metal oxide stack to ensure complete etching without any remaining residues, while preventing over-etching to avoid damage to the patterned metal oxide stack. For example, an etch process should be selective toward photoresist material to prevent etching the photoresist mask 675. Further, an etch process for the metal oxide layer should be selective toward polysilicon to prevent etching the silicon underlayer 630. Selectivity between the layers is also preferred to enable device structure optimization.

In some embodiments, the metal oxide stack can be patterned by a plurality of all selective dry etch processes, by a plurality of all selective wet etch processes, or by a combination of selective wet and dry etching processes. The etch process of one or more layers is preferably selective toward the topmost photoresist layer to prevent etching the photoresist layer, and also selective toward the bottom layer to enable over-etch of the desired layers without etching the bottom layer. The selective etch process can be used on one layer, such as the capping layer, or on a plurality of layers, such as a combination of TiN electrode and $HfO_2$ metal layers.

In some embodiments, the present invention integrates different etch processes to provide optimized selective etch sequences for metal oxide multi-layer substrates. Various etch processes are evaluated for their etch rates and selectivity with respect to other layers in a metal oxide multi-layer pattern.

In some embodiments, a physical sputter etch is disclosed for etching a capping layer of platinum. The physical sputter etch can be performed by energetic charged particles such as argon ions, supplied by a plasma or an ion source. The following description describes argon as the particles used in physical sputter etch, but other inert gases can be used. The etch rate can be adjusted by changing the argon gas flow and the radio frequency (RF) power. The argon sputter etch process can provide high platinum etch rate with negligible etch rate on TiN or TaN, enabling etching platinum while stopping on a bottom layer of TiN or TaN top electrode. The ion-bombarded photoresists are found to have improved mask properties for sputter-etching, even though photo resist removal rate by the oxygen plasma ashing technique is reduced for the ion-bombarded photoresist. Therefore, the argon sputter etch can essentially etch the platinum while preserving the photoresist mask for patterning subsequent layers. The RF power can be less than about 500 W. The argon gas flow rate can be less than about 120 sccm (standard cubic centimeter per minute). In some embodiments, the argon sputter etch process comprises an RF power of about 250 W with an argon gas flow rate of about 60 sccm. The process time can be less than about 10 minutes, and preferably about 4 minutes for a platinum capping layer of less than about 40 nm.

In some embodiments, a capping layer of tungsten and a top electrode layer of TiN can be selectively etched using either a wet etch solution comprising $NH_4OH/H_2O_2$ or a dry etch process comprising reactive ion etching using etching gases of $CHF_3$ and oxygen. The wet etch solution of $NH_4OH/H_2O_2$ can be adjusted, for example, by varying the concentration, to change the selectivity. For example, at about 1:1:100 concentration (e.g., 1 part of $NH_4OH$ and 1 part of $H_2O_2$ in 100 part of water), tungsten and TiN can be sufficiently etched without etching the photoresist or the metal oxide underlayer. At high concentrations, for example, greater than about 1:1:10 concentration, higher etch rates of tungsten and TiN can be achieved, but with partial etch rate of photoresist. At low concentrations, for example, less than about 1:1:100 concentration, the etch rate of TiN increases while the etch rate of tungsten decreases. Thus in some embodiments, the etch process of tungsten capping layer and TiN electrode layer can be optimized by adjusting the concentration of the wet etch solution comprising $NH_4OH/H_2O_2$. In some embodiments, the $NH_4OH/H_2O_2$ wet etch solution can be used to selectively etch TiN for metal oxide stack having no tungsten layer, stopping on metal oxide layer.

In some embodiments, the volume ratio of $NH_4OH$, $H_2O_2$ and water in a mixture of $NH_4OH:H_2O_2:H_2O$ is between about 1:1:50 and about 1:1:200, and the temperature of the $NH_4OH/H_2O_2$ solution is between about 60 and about 80 C.

In some embodiments, a reactive ion etching process using etching gases of $CHF_3$ and oxygen can be used to selectively etch a capping layer of tungsten and/or a top electrode layer of TiN. The metal oxide layer of $HfO_2$ or $ZrO_2$ can also be etched effectively using the reactive ion etching process with minimum etching on polysilicon. This dry etch chemistry thus can be used in metal oxide stacks comprising tungsten capping layer/TiN top electrode/$HfO_2$ or $ZrO_2$ metal oxide/polysilicon substrate; or TiN top electrode/$HfO_2$ or $ZrO_2$ metal oxide/polysilicon substrate.

The etch rate of $CHF_3/O_2$ chemistry can be adjusted by changing the ratio and flow rate of $CHF_3$ gas flows and the radio frequency (RF) power. The plasma etch with $CHF_3/O_2$ chemistry can have high selectivity between $HfO_2/ZrO_2$ and poly-Si and have minimum effect on polysilicon underlayer, allowing over-etch of TiN and metal oxide while stopping on polysilicon. The RF power can be less than about 1000 W. The $CHF_3$ flow rate can be less than about 25 sccm. The $O_2$ flow rate can be less than about 12 sccm. In some embodiments, argon gas can be provided for dilution, with an argon flow rate of less than about 120 sccm. In some embodiments, the plasma etch with $CHF_3/O_2$ chemistry comprises an RF power of about 450 W with an argon gas flow rate of about 60 sccm, a $CHF_3$ flow rate of about 12 sccm, and an $O_2$ flow rate of about 6 sccm.

In some embodiments, a top electrode layer of TaN can be selectively etched using either a wet etch solution comprising $H_2O_2$/ethylene diamine tetra acetic acid (EDTA) or a dry etch process comprising reactive ion etching using etching gases of $C_2F_4$ and oxygen. The wet etch solution of $H_2O_2$/EDTA can selectively etch TaN and stop on the metal oxide layer of $HfO_2$ or $ZrO_2$. In some embodiments, the temperature of the $H_2O_2$/EDTA solution is between about 50 and about 80 C, and preferably is about 65 C.

In some embodiments, a reactive ion etching process using etching gases of $C_2F_4$ and oxygen can be used to selectively etch a top electrode layer of TaN. The metal oxide layer of $HfO_2$ or $ZrO_2$ can also be etched effectively using the reactive ion etching process with minimum etching on polysilicon. This dry etch chemistry thus can be used in metal oxide stacks comprising TaN top electrode/$HfO_2$ or $ZrO_2$ metal oxide/polysilicon substrate.

In some embodiments, a metal oxide layer of $HfO_2$ or $ZrO_2$ can be selectively etched using either a wet etch solution comprising HF/HCl or a dry etch process comprising reactive ion etching using etching gases of $CHF_3/O_2$ or $C_2F_4/O_2$. The wet etch solution of HF/HCl can be adjusted, for example, by varying the concentration, to change the selectivity with the polysilicon underlayer. In some embodiments, the volume ratio of HF, HCl and water in a mixture of $HF:HCl:H_2O$ is between about 1:2:40 and about 1:1:120, and the temperature of the $HF:HCl:H_2O$ solution is between about 60 and about 80 C.

In some embodiments, a reactive ion etching process using etching gases of $C_2F_4$ and oxygen can be used to selectively etch a metal oxide layer of $HfO_2$ or $ZrO_2$. The metal oxide layer of $HfO_2$ or $ZrO_2$ can also be etched effectively using the reactive ion etching process with minimum etching on polysilicon. This dry etch chemistry thus can be used in metal oxide stacks comprising $HfO_2$ or $ZrO_2$ metal oxide/polysilicon substrate.

In some embodiments, a reactive ion etching process using etching gases of $CHF_3$ and oxygen can be used to selectively etch a metal oxide layer of $HfO_2$ or $ZrO_2$. The metal oxide layer of $HfO_2$ or $ZrO_2$ can also be etched effectively using the reactive ion etching process with minimum etching on polysilicon. This dry etch chemistry thus can be used in metal oxide stacks comprising $HfO_2$ or $ZrO_2$ metal oxide/polysilicon substrate.

The etch rate of $CHF_3/O_2$ chemistry for a metal oxide layer of $HfO_2$ or $ZrO_2$ can be adjusted by changing the ratio and flow rate of $CHF_3$ gas flows and the radio frequency (RF) power. The RF power can be less than about 1000 W. The $CHF_3$ flow rate can be less than about 25 sccm. The $O_2$ flow rate can be less than about 12 sccm. In some embodiments, argon gas can be provided for dilution, with argon flow rate less than about 120 sccm. In some embodiments, the plasma etch with $CHF_3/O_2$ chemistry comprises an RF power of about 450 W with an argon gas flow rate of about 60 sccm, a $CHF_3$ flow rate of about 12 sccm, and an $O_2$ flow rate of about 6 sccm.

In some embodiments, the present invention discloses a combination of selective wet and dry etching processes to pattern the metal oxide stack. For example, to pattern a metal oxide stack comprising a capping layer of platinum on a top electrode layer of titanium nitride on a metal oxide layer of $HfO_2$ or $ZrO_2$, the processes can comprise a physical sputtering to etch platinum, which can be highly selective against a photoresist patterned layer and the top electrode materials of titanium nitride. The physical sputter etch can be performed by energetic charged particles such as argon ions (or other inert gases), supplied by a plasma or an ion source. The top electrode of TiN layer then can be selectively wet etched using Standard Clean 1 (SC-1, comprising a mixture of $NH_4OH$ and $H_2O_2$), stopping on the metal oxide of $HfO_2$ or $ZrO_2$. A wet etch solution comprising dilute HF and HCl can be effective in etching the metal oxide layer of $HfO_2$ or $ZrO_2$ with minimum damage to isolation layer of $SiO_2$ and stopping on the polysilicon substrate.

In some embodiments, the present invention discloses a method for patterning a metal oxide stack comprising a capping platinum layer on an electrode TiN layer on a metal oxide $HfO_2$ or $ZrO_2$ layer on a silicon substrate. An exemplary method comprises forming a metal oxide stack comprising a capping platinum layer on an electrode TiN layer on a metal oxide $HfO_2$ or $ZrO_2$ layer on a silicon substrate; selectively etching the capping layer of platinum using a physical sputter process; selectively etching the top electrode layer of TiN using a first wet etch process, wherein the first wet etch process comprises a first solution comprising $NH_4OH$ and $H_2O_2$; and selectively etching the metal oxide layer of $HfO_2$ or $ZrO_2$ using a second wet etch process, wherein the second wet etch process comprises a second solution comprising HF and HCl. In some embodiments, the physical sputter etch process comprises an RF power less than about 500 W, preferably about 250 W, and an argon flow rate less than about 120 sccm, preferably about 60 sccm. In some embodiments, the first solution comprises a mixture of $NH_4OH/H_2O_2/H_2O$ having volume ratio between about 1:1:50 and about 1:1:200, and preferably about 1:2:100. The temperature of the first solution can be between about 60 and about 80 C, and preferably between about 65 and about 75 C. In some embodiments, the second solution comprises a mixture of $HF/HCl/H_2O$ having volume ratio between about 1:2:40 and about 1:2:120, and preferably about 1:2:80. The temperature of the second solution can be between about 40 and about 80 C, and preferably about 60 C.

In some embodiments, the present invention discloses a combination of selective wet and dry etching processes to pattern the metal oxide stack. For example, to pattern a metal oxide stack comprising a capping layer of platinum on a top electrode layer of tantalum nitride on a metal oxide layer of $HfO_2$ or $ZrO_2$, the processes can comprise a physical sputtering to etch platinum, which can be highly selective against photoresist patterned layer and the top electrode materials of tantalum nitride. The top electrode of TaN layer then can be selectively wet etched using an etch solution comprising ethylene diamine tetra acetic acid (EDTA) and $H_2O_2$, stopping on the metal oxide of $HfO_2$ or $ZrO_2$. A wet etch solution comprising dilute HF and HCl can be effective in etching the metal oxide layer of $HfO_2$ or $ZrO_2$ with minimum damage to an isolation layer of $SiO_2$ and stopping on the polysilicon substrate.

In some embodiments, the present invention discloses a method for patterning a metal oxide stack comprising a capping platinum layer on an electrode TaN layer on a metal oxide $HfO_2$ or $ZrO_2$ layer on a silicon substrate. An exemplary method comprises forming a metal oxide stack comprising a capping platinum layer on an electrode TaN layer on a metal oxide $HfO_2$ or $ZrO_2$ layer on a silicon substrate; selectively etching the capping layer of platinum using a physical sputter process; selectively etching the top electrode layer of TaN using a first wet etch process, wherein the first wet etch process comprises a first solution comprising ethylene diamine tetra acetic acid (EDTA) and $H_2O_2$; and selectively etching the metal oxide layer of $HfO_2$ or $ZrO_2$ using a second wet etch process, wherein the second wet etch process comprises a second solution comprising HF and HCl. In some embodiments, the physical sputter etch process comprises an RF power less than about 500 W, preferably about 250 W, and an argon flow rate less than about 120 sccm, preferably about 60 sccm. In some embodiments, the temperature of the first solution can be between about 50 and about 80 C, and preferably about 65 C. In some embodiments, the second solution comprises a mixture of $HF/HCl/H_2O$ having volume ratio between about 1:2:40 and about 1:2:120, and preferably about 1:2:80. The temperature of the second solution can be between about 40 and about 80 C, and preferably about 60 C.

In some embodiments, the present invention discloses a combination of selective dry etching processes to pattern the metal oxide stack. For example, to pattern a metal oxide stack comprising a capping layer of platinum on a top electrode layer of titanium nitride on a metal oxide layer of $HfO_2$ or $ZrO_2$, the processes can comprise a physical sputter to etch a capping layer of platinum, followed by a selectively plasma etched using $CHF_3$ and oxygen chemistries, etching the top TiN electrode and the metal oxide of $HfO_2$ or $ZrO_2$, stopping on the polysilicon substrate.

In some embodiments, the present invention discloses a method for patterning a metal oxide stack comprising a capping platinum layer on an electrode TiN layer on a metal oxide $HfO_2$ or $ZrO_2$ layer on a silicon substrate. An exemplary method comprises forming a metal oxide stack comprising a capping platinum layer on an electrode TiN layer on a metal oxide $HfO_2$ or $ZrO_2$ layer on a silicon substrate; selectively etching the capping layer of platinum using a physical sputter process; selectively etching the top electrode layer of TiN and the metal oxide layer of $HfO_2$ or $ZrO_2$ using a plasma etch process, wherein the plasma etch process comprises $CHF_3$ and oxygen. In some embodiments, the physical sputter etch process comprises an RF power less than about 500 W, preferably about 250 W, and an argon flow rate less than about 120 sccm, preferably about 60 sccm. In some embodiments, the plasma etch using $CHF_3$ and oxygen comprises an RF power less than about 1000 W, preferably about 450 W, an argon flow rate of less than about 120 sccm, and preferably about 60 sccm, a $CHF_3$ flow rate less than about 25 sccm, and preferably about 12 sccm, and an O2 flow rate less than about 12 sccm, and preferably about 6 sccm.

In some embodiments, the combination of selective dry etching processes to pattern different metal oxide stacks. For example, to pattern a metal oxide stack comprising a capping layer of tungsten on a top electrode layer of TiN on a metal oxide layer of $HfO_2$ or $ZrO_2$, the processes can comprise a plasma etch utilizing $CHF_3$ and oxygen.

In some embodiments, the present invention discloses a method for patterning a metal oxide stack comprising a capping tungsten layer on an electrode TiN layer on a metal oxide $HfO_2$ or $ZrO_2$ layer on a silicon substrate. An exemplary method comprises forming a metal oxide stack comprising a capping tungsten layer on an electrode TiN layer on a metal oxide $HfO_2$ or $ZrO_2$ layer on a silicon substrate; selectively etching the capping layer of platinum, the top electrode layer of TiN and the metal oxide layer of $HfO_2$ or $ZrO_2$ using a plasma etch process, wherein the plasma etch process comprises $CHF_3$ and oxygen. In some embodiments, the plasma etch using $CHF_3$ and oxygen comprises an RF power less than about 1000 W, preferably about 450 W, an argon flow rate less than about 120 sccm, and preferably about 60 sccm, a $CHF_3$ flow rate less than about 25 sccm, and preferably about 12 sccm, and an O2 flow rate less than about 12 sccm, and preferably about 6 sccm.

In some embodiments, the combination of selective dry etching processes to pattern different metal oxide stacks. For example, to pattern a metal oxide stack comprising a capping layer of platinum on a top electrode layer of TaN on a metal oxide layer of $HfO_2$ or $ZrO_2$, the processes can comprise a physical sputter to etch a capping layer of platinum, followed by a plasma etch utilizing $C_2F_4$ and oxygen.

In some embodiments, the present invention discloses a method for patterning a metal oxide stack comprising a capping platinum layer on an electrode TaN layer on a metal oxide $HfO_2$ or $ZrO_2$ layer on a silicon substrate. An exemplary method comprises forming a metal oxide stack comprising a capping platinum layer on an electrode TaN layer on a metal oxide $HfO_2$ or $ZrO_2$ layer on a silicon substrate; selectively etching the capping layer of platinum using a physical sputter process; selectively etching the top electrode layer of TaN and the metal oxide layer of $HfO_2$ or $ZrO_2$ using a plasma etch process, wherein the plasma etch process comprises $C_2F_4$ and oxygen. In some embodiments, the physical sputter etch process comprises an RF power less than about 500 W, preferably about 250 W, and an argon flow rate less than about 120 sccm, preferably about 60 sccm.

In some embodiments, the present invention discloses a combination of selective wet etching processes to pattern the metal oxide stack. For example, to pattern a metal oxide stack comprising a capping layer of tungsten on a top electrode layer of titanium nitride on a metal oxide layer of $HfO_2$ or $ZrO_2$, the processes can comprise a Standard Clean 1 (SC-1, comprising a mixture of $NH_4OH$ and $H_2O_2$) to selectively etch a cap layer of tungsten, together with a top electrode layer of TiN, stopping on the metal oxide layer of $HfO_2$ or $ZrO_2$. A wet etch solution comprising dilute HF and HCl can be effective in etching the metal oxide layer of $HfO_2$ or $ZrO_2$ with minimum damage to isolation layer of $SiO_2$ and stopping on the polysilicon substrate.

Figure 7:
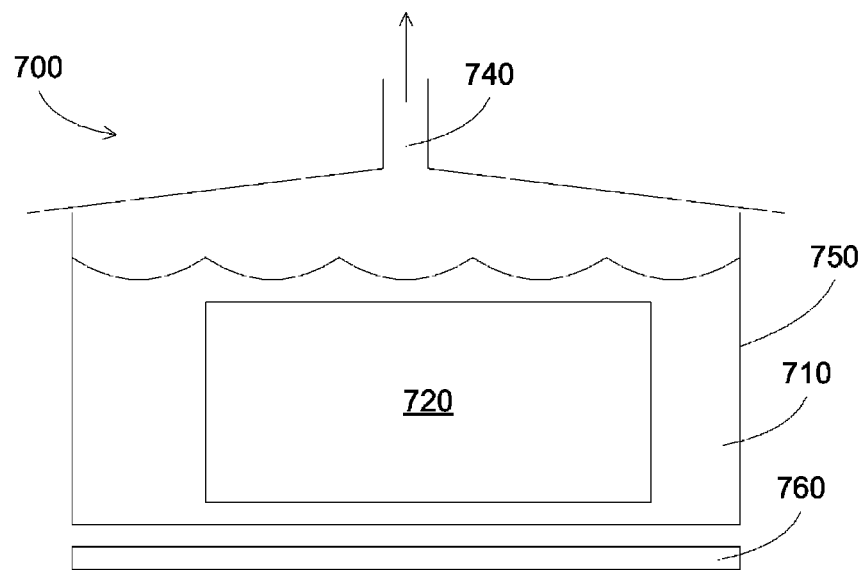
FIG. 7 illustrates an exemplary wet etching apparatus employing an etching solution according to some embodiments of the present invention.

FIG. 7 illustrates an exemplary wet etching apparatus employing an etching solution according to some embodiments of the present invention. A wet etching system 700 comprises a container 750 containing an etch liquid 710, such as a solution of HF/HCl, $NH_4OH/H_2O_2$, or $EDTA/H_2O_2$. A lid having an exhaust port 740 is disposed on the container 750 to capture any released gas. A substrate 720 is submerged in the liquid 710. Optionally, a heater, such as a resistive heater 760, is included to heat the liquid 710.

Figure 8:
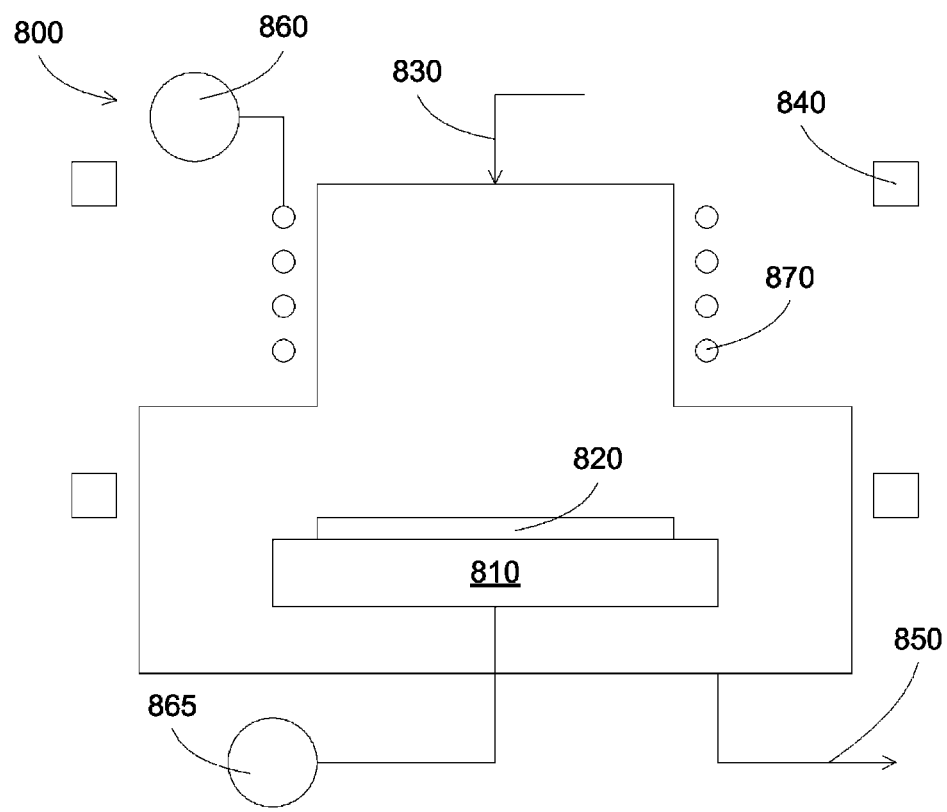
FIG. 8 illustrates an exemplary plasma etching apparatus according to some embodiments of the present invention.

FIG. 8 illustrates an exemplary plasma etching apparatus according to some embodiments of the present invention. The system shown is a high-density plasma reactor, such as an inductive coupled plasma reactor, but other plasma reactors can be used.

Reactor 800 includes a reactor chamber evacuated by a pump system 850 to achieve a sub-atmospheric pressure within the reactor. The pump system 850 can be used to evacuate gas species from the reactor chamber. A gas delivery system 830 can provide process gas into the reactor chamber, preferably directed at the substrate 820. The gas delivery system can provide argon gas typically for dilution purpose. The gas delivery system can also provide etch chemistries, such as $CHF_3$, $C_2F_4$, and oxygen, diluted with argon.

A coil electrode 870 is connected to a power supply 860 which provides power to the electrode, for example, at 13.56 MHz and about 450 W. In some embodiments, the frequency preferably can range from about 1 MHz to about 950 MHz. The power can also preferably be supplied in the range of about 200 watts to about 3,000 watts with a voltage of between about 100 volts to about 5,000 volts. The power supply 860 can excite the gas within the reactor, generating plasma with fluorine or chlorine ions to etch materials on the substrate surface.

A second power supply 865 is connected to the bottom electrode 810, also acting as a substrate support for substrate 820. The second power supply 865 can provide RF or DC bias, preferably at low frequency of about 10 KHz to about 1 MHz with a power range of about 2 watts to about 1,000 watts, and a voltage range of about 5 volts to about 3,000 volts. The power supply 865 can also comprise a DC power supply.

A plurality of magnets 840 is disposed around the reactor 800, to define a magnetic confinement volume in the reactor. This magnetic confinement volume can serve to confine the charged ion species in the reactor, and to concentrate the charge ion species on the substrate 820. The magnetic confinement volume also prevents the charged ion species from collecting on the reactor walls. The plasma reactor can be used for numerous plasma processes such as reactive ion etching (RIE), high pressure plasma etching, physical sputter etching, or ion beam etching.

The above system and ranges of operation are described for illustrative purpose only. Other features and enhancements for an etch system employing reactive species and argon sputtering species are also within the scope of the present invention. For example, the etch system can use microwave and microwave electroncylotron resonance power, capacitance coupled plasma system, matching network, etc.

In some embodiments, the present invention discloses a method for patterning a metal oxide stack comprising a capping tungsten layer on an electrode TiN layer on a metal oxide $HfO_2$ or $ZrO_2$ layer on a silicon substrate. An exemplary method comprises forming a metal oxide stack comprising a capping tungsten layer on an electrode TiN layer on a metal oxide $HfO_2$ or $ZrO_2$ layer on a silicon substrate; selectively etching the capping layer of tungsten and the top electrode layer of TiN using a first wet etch process, wherein the first wet etch process comprises a first solution comprising $NH_4OH$ and $H_2O_2$; and selectively etching the metal oxide layer of $HfO_2$ or $ZrO_2$ using a second wet etch process, wherein the second wet etch process comprises a second solution comprising HF and HCl. In some embodiments, the first solution comprises a mixture of $NH_4OH:H_2O_2:H_2O$ having volume ratio between about 1:1:50 and about 1:1:200, and preferably about 1:2:100. The temperature of the first solution can be between about 60 and about 80 C, and preferably between about 65 and v75 C. In some embodiments, the second solution comprises a mixture of $HF/HCl/H_2O$ having volume ratio between about 1:2:40 and about 1:2:120, and preferably about 1:2:80. The temperature of the second solution can be between about 40 and about 80 C, and preferably about 60 C.

In some embodiments, exemplary flowcharts for forming a memory device are disclosed. The described flowcharts comprise a general description of techniques used to form the memory elements described above. The flowcharts describe techniques for forming a memory element generally including two electrodes and at least one layer of metal oxide disposed therebetween. Although certain processing techniques and specifications are described, it is understood that various other techniques and modifications of the techniques described herein may also be used.

Figure 9:
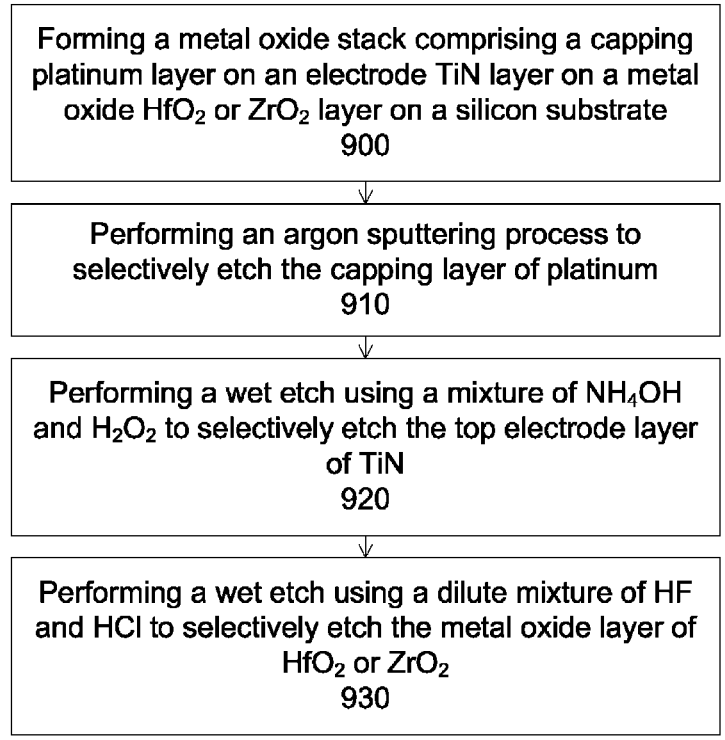
FIG. 9 illustrates an exemplary flowchart for forming a memory device according to some embodiments of the present invention.

FIG. 9 illustrates an exemplary flowchart for forming a memory device according to some embodiments of the present invention. In operation 900, a metal oxide stack is formed, comprising a capping platinum layer on an electrode TiN layer on a metal oxide $HfO_2$ or $ZrO_2$ layer on a silicon substrate.

In some embodiments, the silicon substrate can be a support substrate comprising a polysilicon layer, such as a doped polysilicon layer in a current steering diode. For example, the polysilicon layer can be a highly doped polysilicon layer that is formed using a conventional CVD or ALD type polysilicon deposition technique. In some cases, an optional native oxide layer removal step may be performed after forming the first layer by use of a wet chemical processing technique, or conventional dry clean process that is performed in a plasma processing chamber. It should be noted that the polysilicon layer may be provided on a substrate that may have the steering device and the electrode formed thereon as well. In some embodiments, the polysilicon layer is between about 50 and about 5000 angstroms (Å) thick.

After preparing the polysilicon substrate, a metal oxide layer of $HfO_2$ or $ZrO_2$ can be formed on the polysilicon substrate, for example, by using an atomic layer deposition (ALD) process. A top TiN electrode can then be deposited over the metal oxide layer, using physical vapor deposition (PVD), ALD, chemical vapor deposition (CVD), evaporation, or another suitable technique. A platinum capping layer can be deposited on the TiN top electrode using PVD. The multi-layer can be subjected to a photolithography process, forming a photoresist mask on the metal oxide stack.

In operation 910, the platinum capping layer is selectively etched using a physical sputter process. In operation 920, the TiN top electrode is selectively etched using a first solution comprising $NH_4OH/H_2O_2$. In operation 930, the $HfO_2$ or $ZrO_2$ metal oxide is selectively etched using a second solution comprising HF/HCl.

Figure 10:
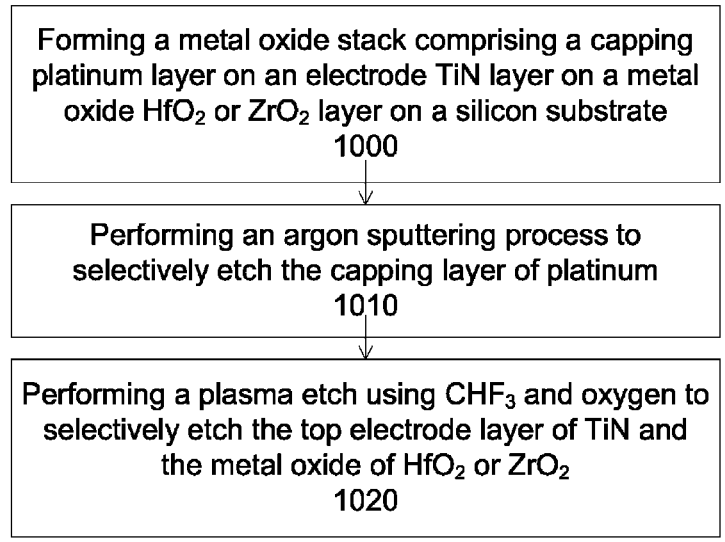
FIG. 10 illustrates another exemplary flowchart for forming a memory device according to some embodiments of the present invention.

FIG. 10 illustrates another exemplary flowchart for forming a memory device according to some embodiments of the present invention. In operation 1000, a metal oxide stack is formed, comprising a capping platinum layer on an electrode TiN layer on a metal oxide $HfO_2$ or $ZrO_2$ layer on a silicon substrate. In operation 1010, the platinum capping layer is selectively etched using a physical sputter process. In operation 1020, the TiN top electrode and the $HfO_2$ or $ZrO_2$ metal oxide are selectively etched using a plasma etch comprising $CHF_3/O_2$ chemistry.

Figure 11:
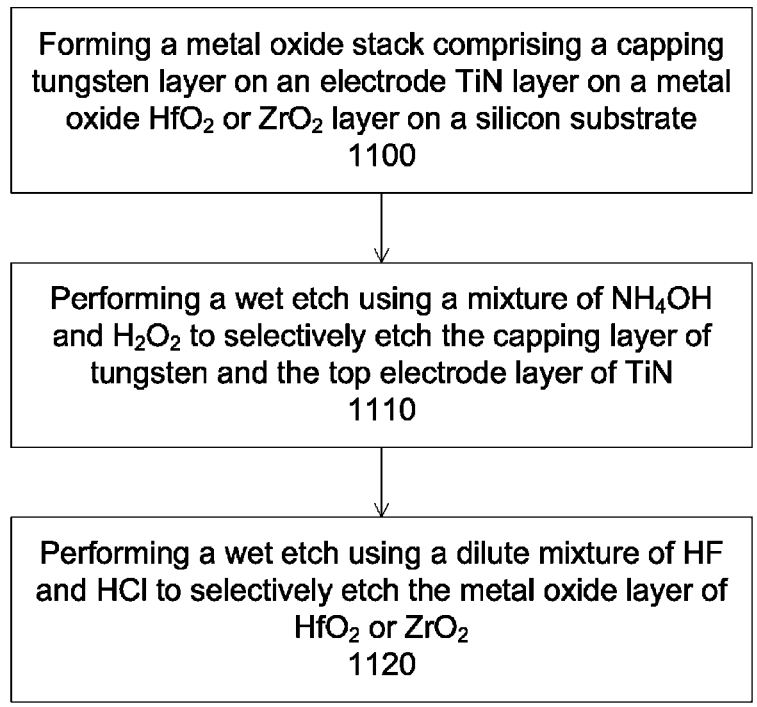
FIG. 11 illustrates another exemplary flowchart for forming a memory device according to some embodiments of the present invention.

FIG. 11 illustrates another exemplary flowchart for forming a memory device according to some embodiments of the present invention. In operation 1100, a metal oxide stack is formed, comprising a capping tungsten layer on an electrode TiN layer on a metal oxide $HfO_2$ or $ZrO_2$ layer on a silicon substrate. In operation 1110, the tungsten capping layer and the TiN top electrode are selectively etched using a first solution comprising $NH_4OH/H_2O_2$. In operation 920, the $HfO_2$ or $ZrO_2$ metal oxide is selectively etched using a second solution comprising HF/HCl.

Figure 12:
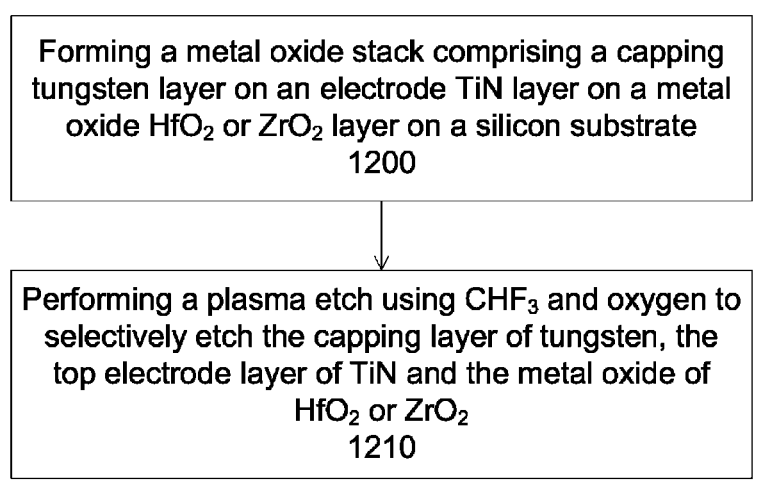
FIG. 12 illustrates another exemplary flowchart for forming a memory device according to some embodiments of the present invention.

FIG. 12 illustrates another exemplary flowchart for forming a memory device according to some embodiments of the present invention. In operation 1200, a metal oxide stack is formed, comprising a capping tungsten layer on an electrode TiN layer on a metal oxide $HfO_2$ or $ZrO_2$ layer on a silicon substrate. In operation 1210, the tungsten capping layer, the TiN top electrode and the $HfO_2$ or $ZrO_2$ metal oxide are selectively etched using a plasma etch comprising $CHF_3/O_2$ chemistry.

Figure 13:
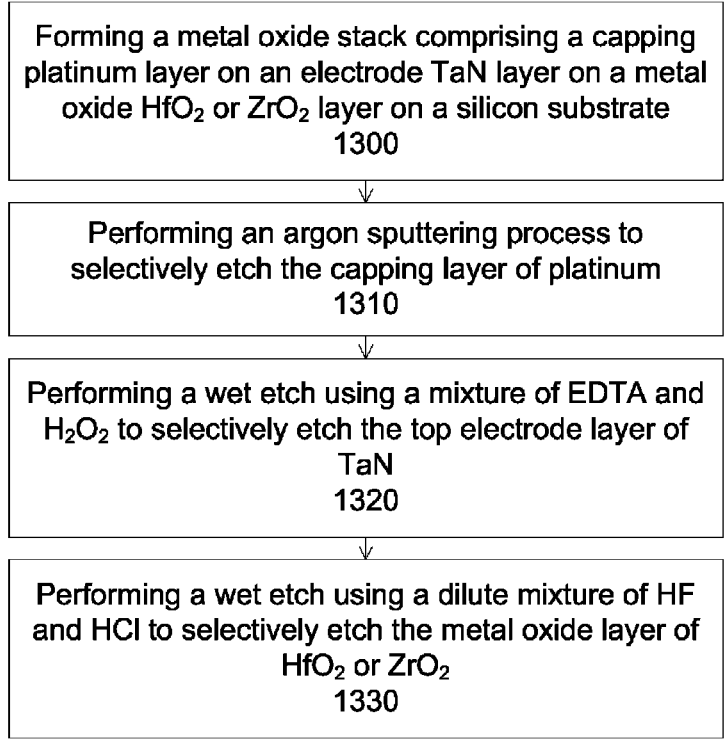
FIG. 13 illustrates an exemplary flowchart for forming a memory device according to some embodiments of the present invention.

FIG. 13 illustrates an exemplary flowchart for forming a memory device according to some embodiments of the present invention. In operation 1300, a metal oxide stack is formed, comprising a capping platinum layer on an electrode TaN layer on a metal oxide $HfO_2$ or $ZrO_2$ layer on a silicon substrate. In operation 1310, the platinum capping layer is selectively etched using a physical sputter process. In operation 1320, the TaN top electrode is selectively etched using a first solution comprising $H_2O_2$/EDTA. In operation 1330, the $HfO_2$ or $ZrO_2$ metal oxide is selectively etched using a second solution comprising HF/HCl.

Figure 14:
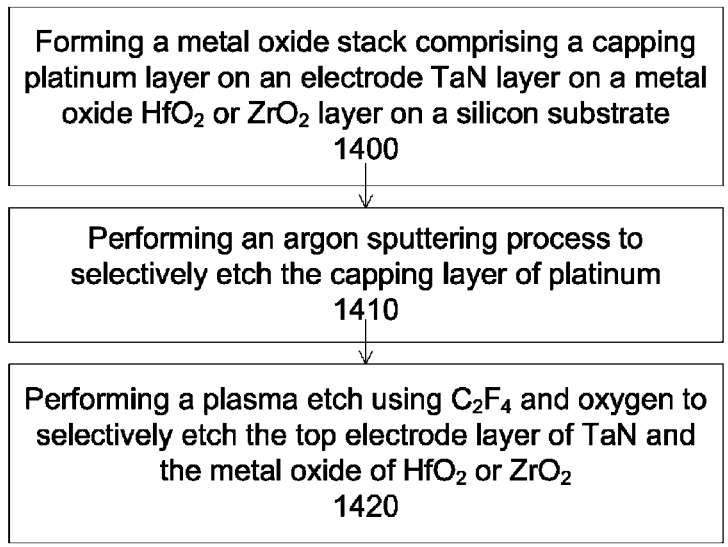
FIG. 14 illustrates an exemplary flowchart for forming a memory device according to some embodiments of the present invention.

FIG. 14 illustrates an exemplary flowchart for forming a memory device according to some embodiments of the present invention. In operation 1400, a metal oxide stack is formed, comprising a capping platinum layer on an electrode TaN layer on a metal oxide $HfO_2$ or $ZrO_2$ layer on a silicon substrate. In operation 1410, the platinum capping layer is selectively etched using a physical sputter process. In operation 1420, the TaN top electrode and the $HfO_2$ or $ZrO_2$ metal oxide are selectively etched using a plasma etch comprising $C_2F_4/O_2$ chemistry.

Although the foregoing examples have been described in some detail for purposes of clarity of understanding, the invention is not limited to the details provided. There are many alternative ways of implementing the invention. The disclosed examples are illustrative and not restrictive.

What is claimed is:
1. A method for patterning a metal oxide stack comprising:
etching a first layer using a physical sputter etch process, wherein the first layer is operable as a capping layer for the metal oxide stack, and wherein the first layer comprises platinum;
etching a second layer using a first wet etch process, wherein the second layer is disposed under the first layer, wherein the second layer is operable as an electrode layer for the metal oxide stack, wherein the second layer comprises TiN, and wherein the first wet etch process comprises a first solution comprising $NH_4OH$ and $H_2O_2$;

etching a third layer using a second wet etch process, wherein the third layer is disposed under the second layer, wherein the third layer is operable as a metal oxide layer for the metal oxide stack, wherein the third layer comprises $HfO_2$ or $ZrO_2$, and wherein the second wet etch process comprises a second solution comprising HF and HCl.

2. A method as in claim 1 wherein the physical sputter etch process comprises an RF power less than about 500 W.

3. A method as in claim 1 wherein the physical sputter etch process comprises an argon flow rate less than about 120 sccm.

4. A method as in claim 1 wherein the first solution comprises a mixture of $NH_4OH:H_2O_2:H_2O$ having a volume ratio between about 1:1:50 and about 1:1:200.

5. A method as in claim 1 wherein the temperature of the first solution is between about 60 and about 80 C.

6. A method as in claim 1 wherein the second solution comprises a mixture of $HF:HCl:H_2O$ having volume ratio between about 1:2:40 and about 1:2:120.

7. A method as in claim 1 wherein the temperature of the second solution is between about 40 and about 80 C.

* * * * *